(12) United States Patent
Imai

(10) Patent No.: US 8,643,386 B2
(45) Date of Patent: Feb. 4, 2014

(54) ELECTROMAGNETIC WAVE INFORMATION DETECTION APPARATUS AND ELECTROMAGNETIC WAVE INFORMATION DETECTION METHOD

(75) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 320 days.

(21) Appl. No.: 13/072,399

(22) Filed: Mar. 25, 2011

(65) Prior Publication Data
US 2011/0241701 A1 Oct. 6, 2011

(30) Foreign Application Priority Data
Mar. 31, 2010 (JP) ................ 2010-084375

(51) Int. Cl.
*G01R 27/04* (2006.01)

(52) U.S. Cl.
USPC .......................................... 324/629; 324/658

(58) Field of Classification Search
USPC ............... 324/629, 658, 76.11; 257/71, 428; 428/1.31
See application file for complete search history.

(56) References Cited

U.S. PATENT DOCUMENTS

| | | | |
|---|---|---|---|
| 6,171,643 B1 | 1/2001 | Polischuk et al. | |
| 6,245,601 B1 | 6/2001 | Kobayashi et al. | |
| 2001/0024844 A1 | 9/2001 | Kobayashi et al. | |
| 2004/0067324 A1* | 4/2004 | Lazarev et al. | 428/1.31 |
| 2005/0156115 A1 | 7/2005 | Kobayashi et al. | |
| 2008/0210946 A1* | 9/2008 | Okada et al. | 257/71 |
| 2009/0189231 A1* | 7/2009 | Okada | 257/428 |
| 2009/0218646 A1* | 9/2009 | Okada | 257/428 |

FOREIGN PATENT DOCUMENTS

| | | |
|---|---|---|
| JP | 11-145443 A | 5/1999 |
| JP | 2008-177556 A | 7/2008 |

OTHER PUBLICATIONS

Street et al., "Image sensors combining an organic photoconductor with a-Si:H matrix addressing", Journal of Non-Cystalline Solids, 299-302, 2002, pp. 1240-1244.

\* cited by examiner

*Primary Examiner* — Vincent Q Nguyen
(74) *Attorney, Agent, or Firm* — Birch, Stewart, Kolasch & Birch, LLP

(57) ABSTRACT

Disclosed is an electromagnetic wave information detection apparatus, including a photoelectric converter including first and second electrode layers; a charge generation layer that generates positive and negative charges by irradiation of an electromagnetic wave; and a charge transport layer; an electric potential imparting unit that imparts electric potentials to the first and second electrode layers; a detection unit; and a control unit controlling the electric potential imparting unit and the detection unit such that the electric potentials of the first and second electrode layers are equalized during a predetermined period of time between a process of imparting detection electric potentials to the first and second electrode layers to detect information carried by an electromagnetic wave of a previous irradiation and a process of imparting the detection electric potentials to the first and second electrode layers to detect information carried by an electromagnetic wave of a subsequent irradiation.

19 Claims, 5 Drawing Sheets

ELECTROMAGNETIC WAVE INFORMATION DETECTION APPARATUS AND ELECTROMAGNETIC WAVE INFORMATION DETECTION METHOD

CROSS-REFERENCE TO RELATED APPLICATION

This application claims priority under 35 USC 119 from Japanese Patent Application No. 2010-84375 filed on Mar. 31, 2010, the disclosure of which is incorporated by reference herein.

BACKGROUND

1. Field of the Invention

The present invention relates to an electromagnetic wave information detection apparatus and an electromagnetic wave information detection method, and more particularly, to an indirect conversion type radiation imaging apparatus and a method which obtain an image by converting radiation into visible light.

2. Related Art

J. Non-Cry. Sol. 299-302 (2002) 1240-1244 discloses an indirect conversion type imaging element that uses a scintillator (GOS: gadolinium oxysulfide) which converts radiation into visible light, and an organic photoelectric conversion film (OPC) which serves as a photoelectric conversion film converting visible light into an electrical signal and is a laminate of a charge generation layer (benzimidazole) and a hole transport layer (polycarbonate and TPD (N,N'-diphenyl-N, N'-bis(3-methylphenyl)-[1,1'-biphenyl]-4,4'-diamine)).

However, the literature does not disclose anything about the presence or absence of an afterimage generation or an elimination method of the afterimage when such an imaging element is used.

U.S. Pat. No. 6,171,643 discloses a direct conversion type radiation imaging element that does not use a scintillator but uses a multi-layer structure containing amorphous selenium and a method of driving the radiation imaging element. The multi-layer structure has a p-layer ($As_2Se_3$ layer), an i-layer (amorphous selenium thick layer), and an n-layer (amorphous selenium layer with doped alkali metal). Sensitivity may be stabilized by short-circuiting between upper and lower electrodes for a short period of time to neutralize space charges in a detector after an X-ray irradiation. This advantage is achieved by a layer ($As_2Se_3$ layer) with lower resistance than that of an amorphous selenium layer that performs generating charges and transporting the charges. Thus, it is considered that the $As_2Se_3$ layer is essential, and the advantage is said to be achieved because the $As_2Se_3$ layer has low resistance since the $As_2Se_3$ layer has more free holes than the amorphous selenium layer. A junction between the $As_2Se_3$ layer and a substrate electrode is said to perform the role of "charge injection", thereby accelerating the neutralization of negative space charges. However, the $As_2Se_3$ layer has problems in that, for example, it has low heat resistance, evaporation cost is high, and toxicity is significant. U.S. Pat. No. 6,171,643 relates to a direct conversion type radiation imaging element that does not use scintillator but uses amorphous selenium, and does not disclose either the presence or absence of an afterimage generation in an imaging element including a photoelectric conversion film having a charge generation layer and a charge transport layer nor an elimination method of the afterimage.

The present inventors have found that sensitivity varies in an imaging element including a photoelectric conversion film having a charge generation layer and a charge transport layer when the imaging element continuously captures images in many times or the imaging element captures an image with a large dosage.

SUMMARY

A main object of the present invention is to provide an electromagnetic wave information detection apparatus and an electromagnetic wave information detection method capable of suppressing variations in sensitivity.

According to a first aspect of the present invention, there is provided an electromagnetic wave information detection apparatus, including:

a photoelectric converter including: a first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and a second electrode layer that is electrically connected to the charge transport layer;

an electric potential imparting unit that imparts respective electric potentials to the first and second electrode layers;

a detection unit that is connected to the photoelectric converter and is configured to detect the information, which is carried by the electromagnetic wave and photoelectrically converted by the photoelectric converter; and a control unit that controls the electric potential imparting unit and the detection unit such that the electric potential imparting unit equalizes the electric potentials of the first and second electrode layers during a predetermined period of time between a process in which the electric potential imparting unit imparts respective detection electric potentials to the first and second electrode layers and the detection unit detects information carried by an electromagnetic wave of a previous irradiation and a process in which the electric potential imparting unit imparts the respective detection electric potentials to the first and second electrode layers and the detection unit detects information carried by an electromagnetic wave of a subsequent irradiation.

According to a second aspect of the present invention, there is provide an electromagnetic wave information detection method, including:

detecting information, which is carried by an electromagnetic wave of an irradiation and is photoelectrically converted by a photoelectric converter, by imparting respective detection electric potentials to first and second electrode layers of the photoelectric converter, which includes: the first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and the second electrode layer, which is electrically connected to the charge transport layer;

thereafter equalizing electric potentials of the first and second electrode layers during a predetermined period of time; and thereafter detecting information of an electromagnetic wave of a subsequent irradiation by imparting the respective detection electric potentials to the first and second electrode layers of the photoelectric converter.

BRIEF DESCRIPTION OF THE DRAWINGS

An exemplary embodiment of the present invention will be described in detail based on the following figures, wherein.

DETAILED DESCRIPTION

Hereinafter, exemplary embodiments of the invention will be described with reference to the accompanying drawings.

(First Exemplary Embodiment)

Figure 1:
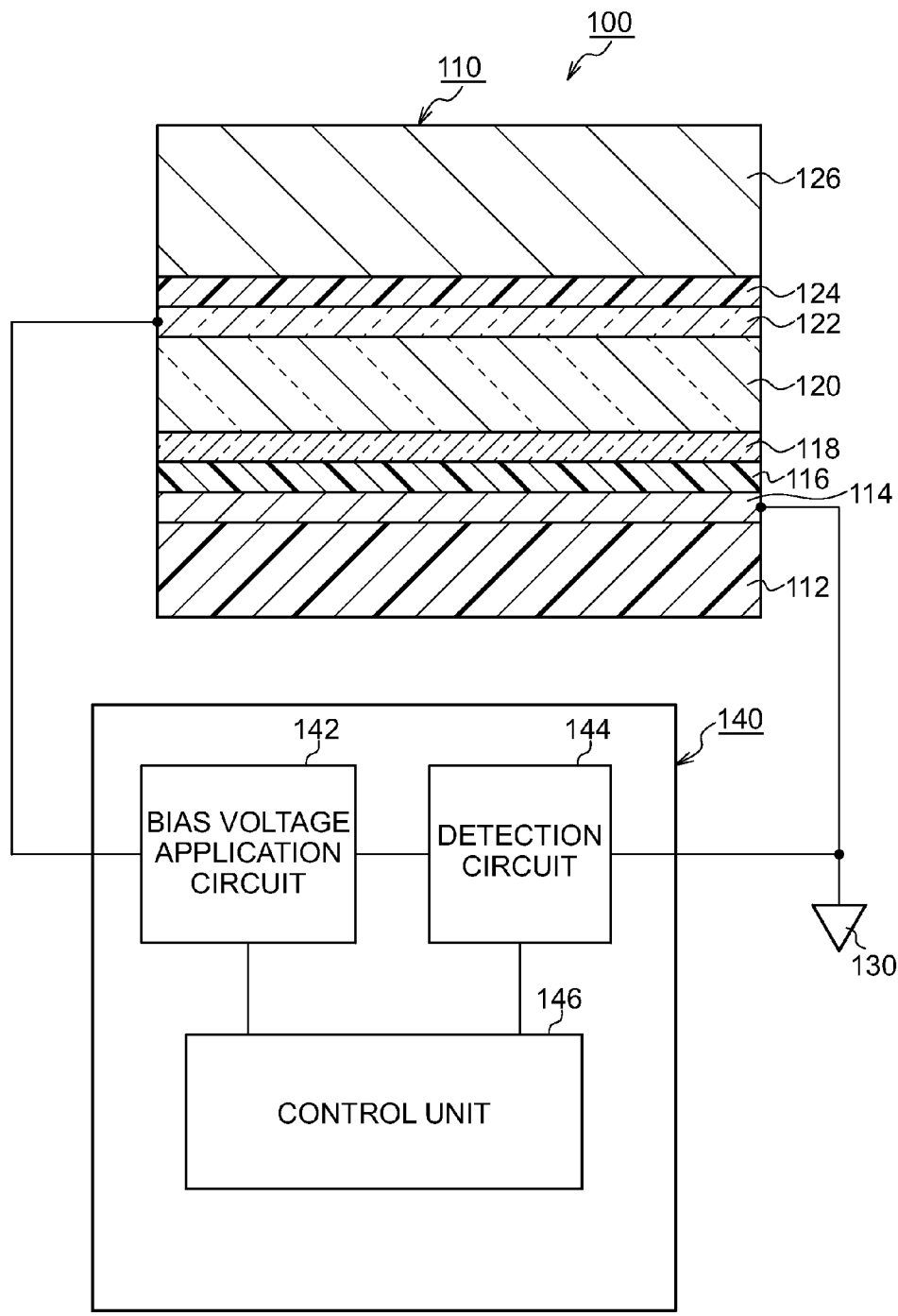
FIG. 1 is a schematic longitudinal sectional view for explaining a radiation dosage monitor and a method of monitoring a radiation dosage according to a first preferred exemplary embodiment of the invention.

Referring to FIG. 1, a radiation dosage monitor 100 according to a first preferred exemplary embodiment includes a sensor unit 110 and a control device 140. The sensor unit 110 includes a flexible substrate 112, an electrode layer 114 disposed on the flexible substrate 112, a polymer undercoat layer 116 disposed on the electrode layer 114, a charge generation layer 118 disposed on the polymer undercoat layer 116, a charge transport layer 120 disposed on the charge generation layer 118, a bias electrode layer 122 disposed on the charge transport layer 120, and a fluorescent layer 126 attached onto the bias electrode layer 122 with an adhesive layer 124 interposed therebetween.

The flexible substrate 112 is made of polyethylene naphthalate (PEN). The electrode layer 114 is made of Indium Tin Oxide (ITO). The polymer undercoat layer 116 includes those obtained by application and drying of alcohol-soluble polyamide, and has function of strongly joining the electrode layer 114 and the charge generation layer 118. The charge generation layer 118 includes a charge generator that generates holes having a positive charge and electrons having a negative charge by being irradiated with electromagnetic wave, and a polymer binder. A dibromoantoanthrone pigment is used as the charge generator, and a polyvinyl butyral resin is used as the polymer binder. The charge transport layer 120 includes a charge transport agent that transports only holes, and a polymer binder. An example of the charge transport agent is N,N'-diphenyl-N,N'-bis(3-methylphenyl)-[1,1'-biphenyl]-4,4'-diamine An example of the polymer binder is polycarbonate. The bias electrode layer 122 is made of indium-zinc oxide (IZO). The adhesion layer 124 includes an acrylic double-sided adhesion tape. The fluorescent layer 126 includes KODAK Lanex Regular ($Ga_2O_2S$: Tb) that is a fluorescent sheet manufactured by KODAK Company.

The sensor unit 110 is manufactured as described below. First, the flexible substrate 112 is prepared in a form in which an ITO film that serves as the electrode layer 114 is formed in a thickness of, for example, 100 nm by sputter deposition of the ITO film, onto polyethylene naphthalate (PEN) having a thickness of, for example, 0.1 mm.

Next, alcohol-soluble polyamide was applied onto the electrode layer 114 made of ITO to be 0.1 µm in thickness by spin coating, and dried to form the polymer undercoat layer 116.

Next, the dibromoantoanthrone pigment and the polyvinyl butyral resin were added, in the mass ratio of 50:50, to cyclohexanone and dispersed. The obtained dispersion was applied by spin coating onto the polymer undercoat layer 116, to form the charge generation layer 118 having a thickness of 0.5 µm.

Next, 3.5 g of N,N'-diphenyl-N,N'-bis(3-methylphenyl)-[1,1'-biphenyl]-4,4'-diamine and 6.5 g of polycarbonate (molecular weight: about 35,000 to 40,000) as the charge transport agent were dissolved in 35 g of methylene chloride, and the obtained solution was applied onto the charge generation layer 118 by bar coating to form the charge transport layer 120. The charge transport layer 120 was dried at 135° C. for 1 hour, and measured for the film thickness. The measured thickness was 2 µm.

Next, IZO was film-formed to have a thickness of 100 nm on the charge transport layer 120 to form the bias electrode layer 122.

Next, the sensor unit 110 of the radiation dosage monitor 100 was manufactured by preparing KODAK Lanex Regular ($Ga_2O_2S$: Tb 380 µm), which is a fluorescent sheet manufactured by KODAK Company and attaching the fluorescent sheet to the bias electrode layer 122 with the use of the adhesive layer 124 (with a thickness of 20 µm) of an acrylic double-sided adhesion tape interposed therebetween to form the fluorescent sheet 116 which serves as an X-ray scintillator.

The control device 140 includes a bias voltage application circuit 142, a detection circuit 144, and a control unit 146. One end of the bias voltage application circuit 142 is connected to the bias electrode layer 122, the other end of the bias voltage application circuit 142 is connected to one end of the detection circuit 144, and the other end of the detection circuit 144 is connected to the electrode layer 114 and a ground potential 130. The bias voltage application circuit 142 and the detection circuit 144 are connected to the control unit 146 to be controlled by the control unit 146.

Next, a method of measuring a radiation dosage using the radiation dosage monitor 100 will be described.

Figure 2:
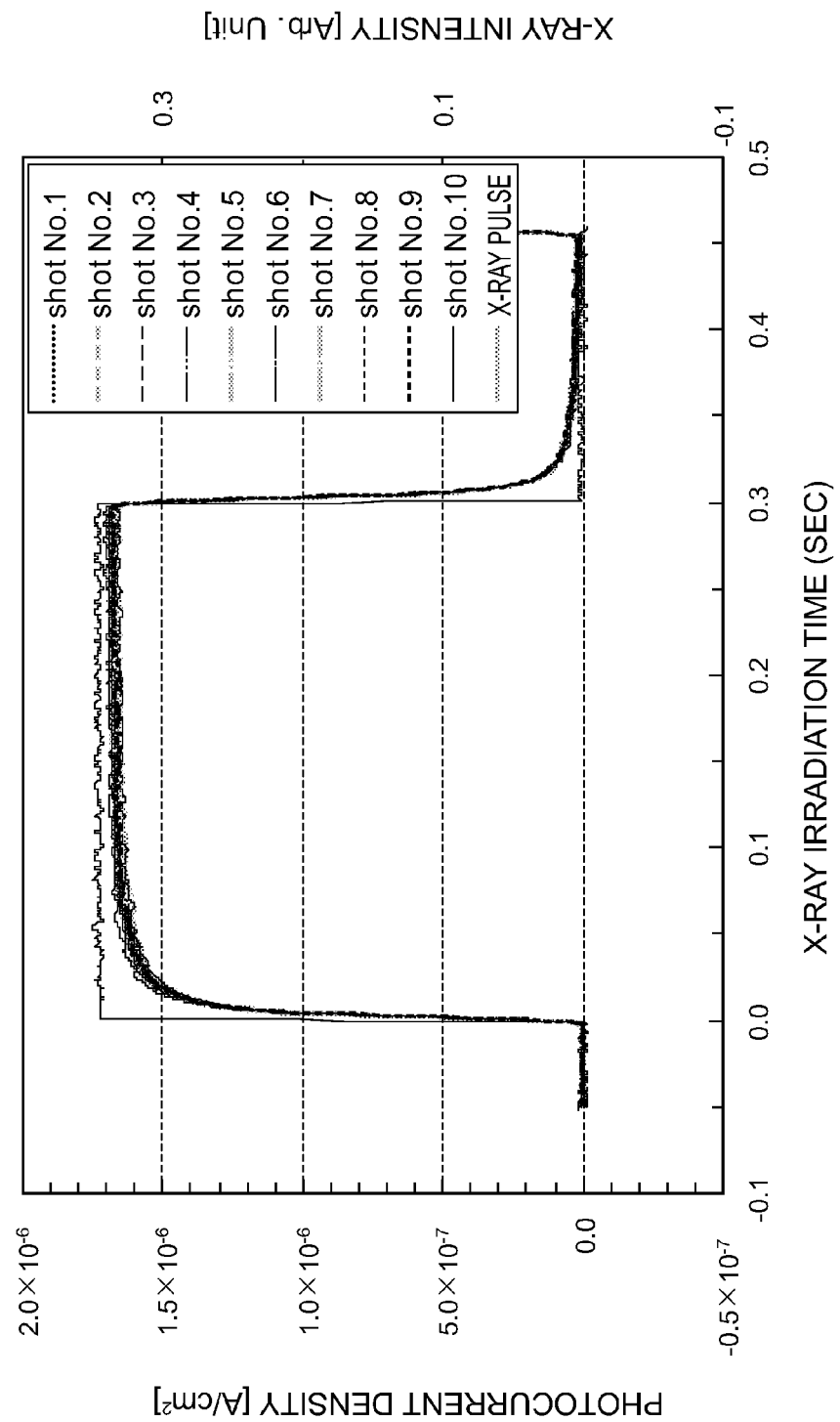
FIG. 2 is a diagram illustrating a relationship between an X-ray irradiation time and a photocurrent density in the radiation dosage monitor according to the first preferred exemplary embodiment of the invention.

The bias voltage application circuit 142 and the detection circuit 144 were controlled by the control unit 146 to apply a bias voltage of −20 V to the bias electrode layer 122, and an X-ray with a dosage of 400 mR (80 kVp) was irradiated by ten shots at an interval of 30 seconds. A photocurrent density for each shot was detected by the detection circuit 144 and the detected photocurrent densities were compared with each other. The voltage application time of each shot was 20 seconds. Before each shot, the bias electrode layer 122 is applied with a ground voltage and the electric potential of the bias electrode layer 122 is set to be the same (short-circuiting) as that of the electrode layer 114. In such a manner, a sensitivity stabilization process was performed. A bias voltage short-circuiting time before detection of the radiation dosage in each shot was set to 10 seconds. As a consequence, as shown in FIG. 2, variations in sensitivity of the photocurrent by X-ray irradiation were within ±1%. In this exemplary embodiment, the bias voltage short-circuiting time was set to 10 seconds. However, when the bias voltage short-circuiting time is 1 second or more, the variations in sensitivity can be sufficiently suppressed. Moreover, the variations in sensitivity can be reliably suppressed when the bias voltage short-circuiting time is 10 seconds or more.

Figure 3:
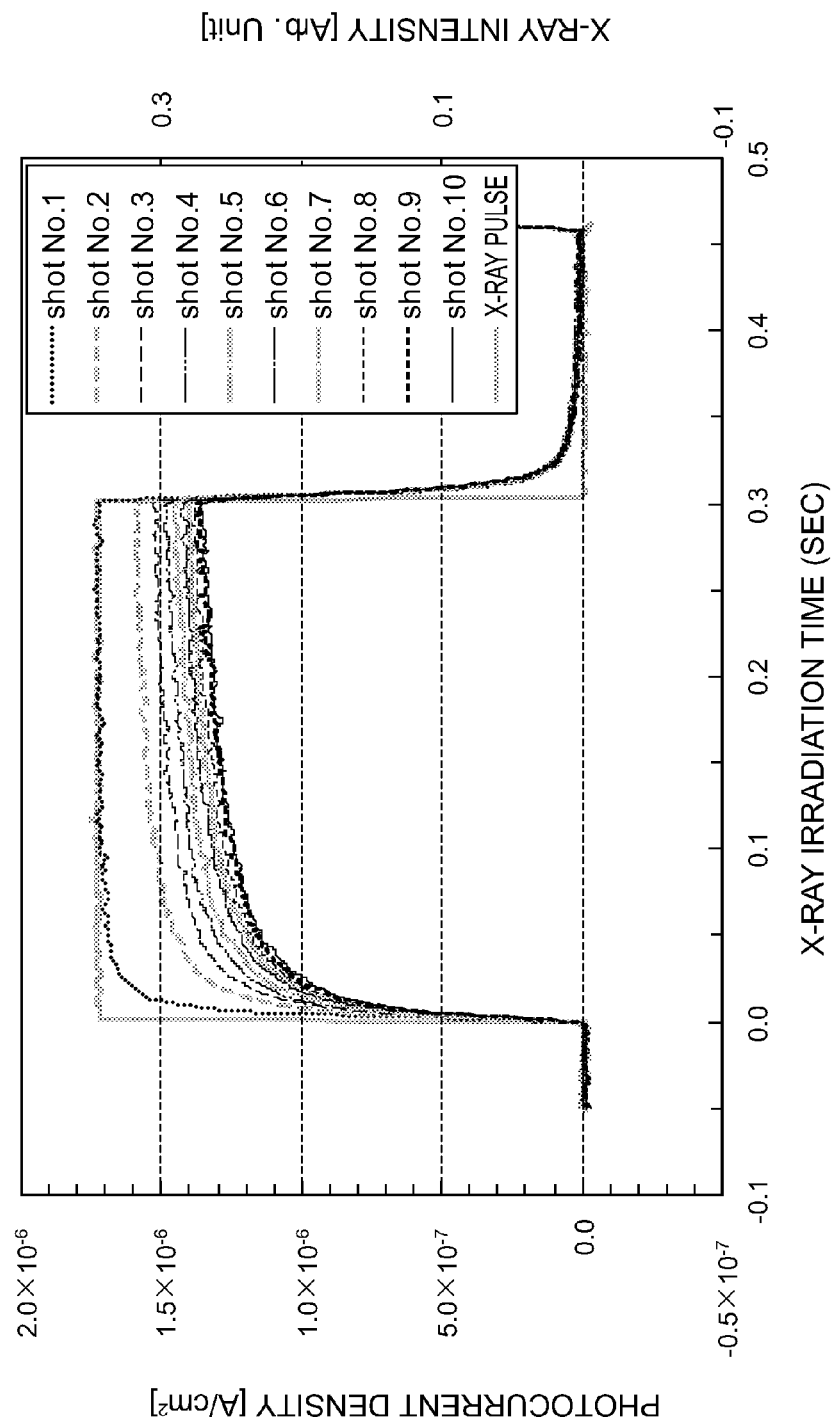
FIG. 3 is a diagram illustrating a relationship between an X-ray irradiation time and a photocurrent density in the radiation dosage monitor according to a Comparative Example 1.

Next, as a Comparative Example 1, the bias voltage application circuit 142 and the detection circuit 144 were controlled by the control unit 146 to apply a bias voltage of −20 V to the bias electrode layer 122, and an X-ray with a dosage of 400 mR (80 kVp) was irradiated by ten shots at an interval of 30 seconds. A photocurrent density for each shot was detected by the detection circuit 144 and the detected photocurrent densities were compared with each other. The voltage application time of each shot was 30 seconds. In the Comparative Example 1, the bias voltage of −20 V was kept to be applied to the bias electrode layer 122 for ten shots and no sensitivity stabilization process described above was performed. As a consequence, as shown in FIG. 3, variations in sensitivity of the photocurrent by X-ray irradiation were ±10% or more.

(Second Exemplary Embodiment)

Figure 4:
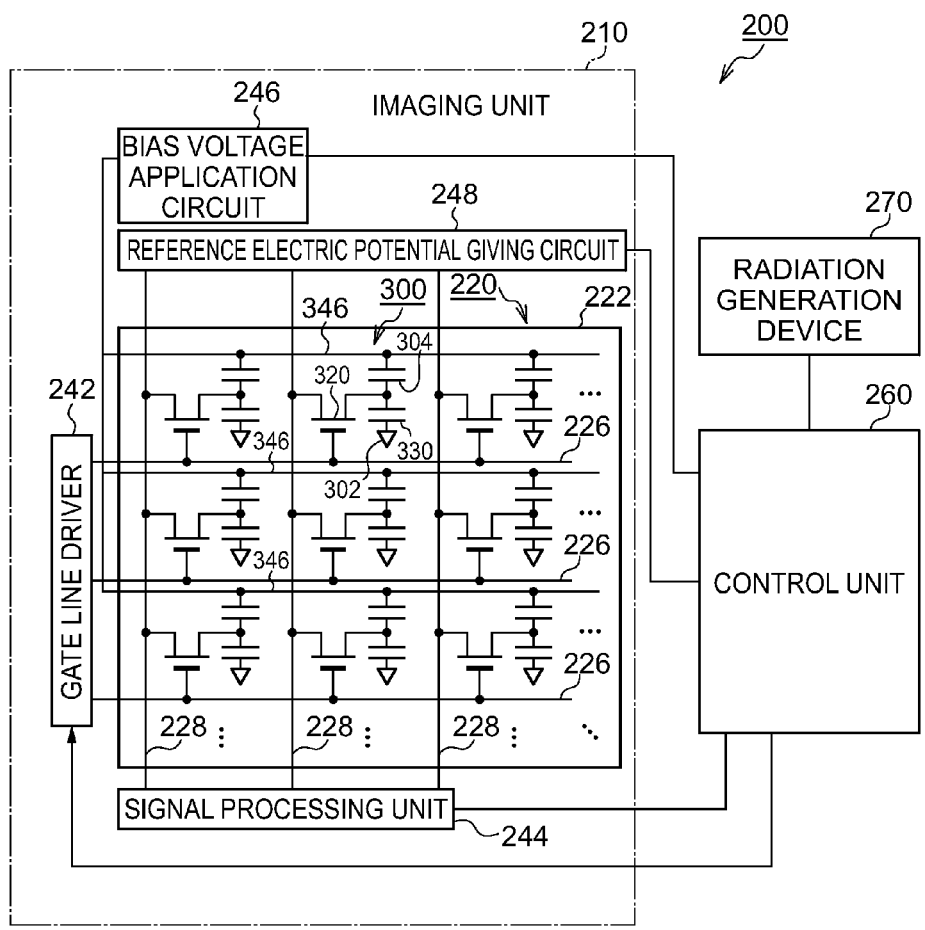
FIG. 4 is a schematic longitudinal sectional view for explaining an indirect conversion type radiation imaging apparatus and an imaging method using the same according to a second preferred exemplary embodiment of the invention.

Referring to FIG. 4, an indirection conversion type radiation imaging apparatus 200 according to a second preferred exemplary embodiment of the present invention includes an imaging unit 210, a control device 260, and a radiation generation device 270.

The imaging unit 210 includes a radiation detection unit 220, a gate line driver 242, a signal processing unit 244, a bias voltage application circuit 246, and a reference electric potential imparting circuit 248.

The control device 260 are connected to the gate line driver 242, the signal processing unit 244, the bias voltage application circuit 246, and the reference electric potential imparting circuit 248. The control device 260 controls the gate line driver 242, the signal processing unit 244, the bias voltage application circuit 246, and the reference electric potential imparting circuit 248.

In the radiation detection unit 220, plural pixel units 300 are disposed on a substrate 222 in a matrix. Each of the pixel units 300 includes a radiation charge conversion unit 304 which converts radiation into charges, a storage capacitor 330 which stores the charges converted by the radiation charge conversion unit 304, and a thin film transistor (TFT) 320 which reads the charges stored in the storage capacitor 330.

Plural gate wiring lines 226 are arranged in a given direction (row direction) and turns on/off the thin film transistors 320 of the respective pixel units 222. Plural signal wiring lines 228 are arranged in a direction (column direction) intersecting the gate wiring lines 226 to read the stored charges from the storage capacitors 330 via the turned-on thin film transistors 320. The gate wiring lines 226 and the signal wiring lines 228 are disposed on the substrate 222.

The gate wiring lines 226 are connected to the gate line driver 242 and the signal wiring lines 228 are connected to the signal processing unit 244. While the pixel units 300 are being irradiated with radiation, the thin film transistors 320 of the pixel units 300 are all turned off in response to signals supplied from the gate line driver 242 via the gate wiring lines 226 under the control of the control device 260, and thus the charges corresponding to the charges that are photoelectrically converted from the radiation by the radiation charge conversion units 304 are stored in the storage capacitors 330 of the pixel units 300. After the pixel units 300 are irradiated with the radiation, the thin film transistors 320 of the pixel units 300 are turned on sequentially one row after another in response to signals supplied from the gate line driver 242 via the gate wiring lines 226 under the control of the control device 260. The charges stored in the storage capacitor 330 of the pixel unit 300 in which the thin film transistor 320 is turned on is transmitted as an analog electric signal and is input to the signal processing unit 244 via the signal wiring line 228. Thus, the charges stored in the storage capacitors 330 of the pixel units 300 are read sequentially by a row.

Each of the signal wiring lines 228 is also connected to the reference electric potential imparting circuit 248. Changeover switches (not shown) switching between the signal processing unit 244 and the reference electric potential imparting circuit 248 for each signal wiring line 228 are respectively provided in the signal processing unit 244 and the reference electric potential imparting circuit 248. The changeover switches perform switching under the control of the control device 260 so that the respective signal wiring lines 228 are connected to either the signal processing unit 244 or the reference electric potential imparting circuit 248.

A bias electrode 346 (see FIG. 5) described below is disposed on the entire surface of the substrate 222. The bias electrode 346 (see FIG. 5) is connected to the bias voltage application circuit 246. Under the control of the control device 260, the bias voltage application circuit 246 applies a predetermined bias voltage or a reference electric potential such as a ground potential to the bias electrode 346 (see FIG. 5). An electrode 332 (storage capacitor lower electrode 332, see FIG. 5) of the storage capacitor opposite to the radiation charge conversion unit 304 is connected to a ground potential 302.

Figure 5:
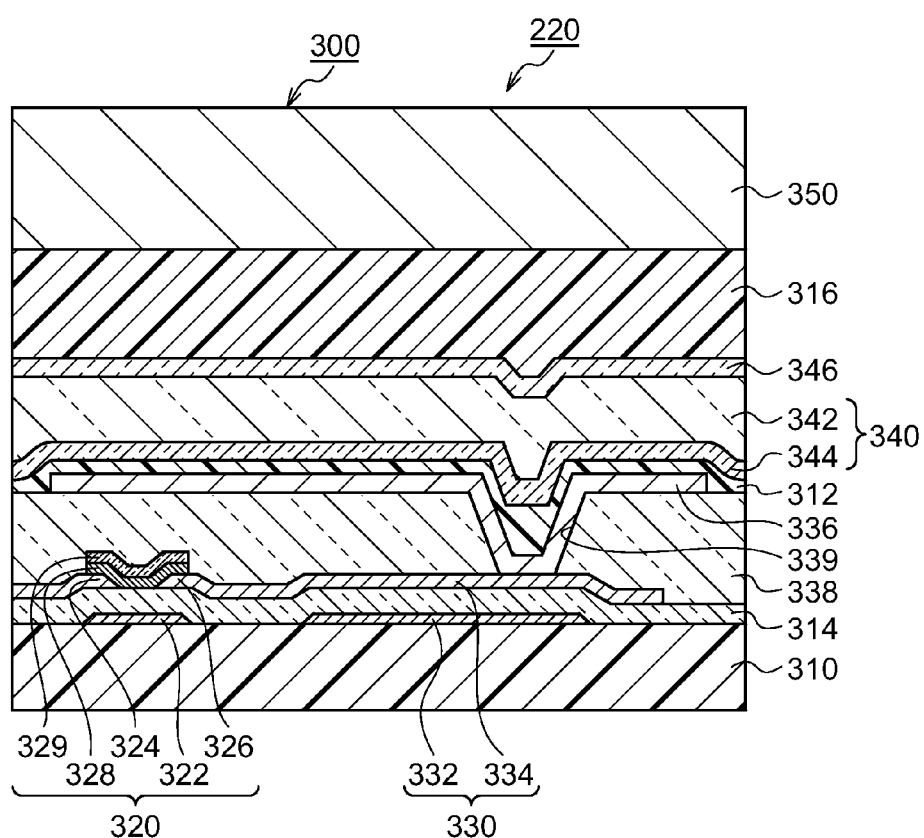
FIG. 5 is a schematic longitudinal sectional view for explaining a pixel unit of the indirect conversion type radiation imaging apparatus according to the second preferred exemplary embodiment of the invention.

Next, each pixel unit 300 of the radiation detection unit 220 will be described with reference to FIG. 5.

The storage capacitors 330 and the thin film transistors 320 are disposed on one surface of the flexible substrate 310. The storage capacitor 330 includes a storage capacitor upper electrode 334, a storage capacitor lower electrode 332, and a dielectric layer 314 (the dielectric layer 314 also functions as an insulation layer) interposed therebetween. The thin film transistor 320 includes a drain electrode 324, a source electrode 326 connected to the storage capacitor upper electrode 334, an active layer (channel layer) 328 located between the source electrode 326 and the drain electrode 324, a protective layer 329 formed to cover the active layer 328, and a gate electrode 322 located opposite to the active layer 328 with the dielectric layer 314 functioning as an insulation layer interposed therebetween.

An inter-layer insulation layer 338 is disposed on the storage capacitors 330 and the thin film transistors 320. A contact hole 339 is disposed in the inter-layer insulation layer 338 on the storage capacitor upper electrode 334. A charge collection electrode (lower electrode) 336 is disposed on the inter-layer insulation layer 338. The charge collection electrode 336 is a pixel electrode. The charge collection electrode 336 is connected to the storage capacitor upper electrode 334 through the contact hole 339.

A polymer undercoat layer 312 is disposed on the charge collection electrode 336. A charge generation layer 344, a charge transport layer 342, and a bias electrode 346 are disposed on the polymer undercoat layer 312 in this order. The charge generation layer 344 and the charge transport layer 342 form an organic photoelectric conversion layer 340. A fluorescent layer 350 is disposed on the bias electrode 346 with an inter-layer insulation layer 316 interposed therebetween.

The flexible substrate 310 is formed by attaching polyethylene naphthalate (PEN) and thin glass to each other. The gate electrode 322 and the storage capacitor lower electrode 332 are made of Mo. The dielectric layer 314 is made of silicon dioxide. The source electrode 326, the drain electrode 324, and the storage capacitor upper electrode 334 are made of IZO. The active layer 328 is made of IGZO (In—Ga—Zn-Oxide). The protective layer 329 is made of amorphous $Ga_2O_3$. The inter-layer insulation layer 338 is made of acrylic resin. The charge collection electrode 336 is made of IZO. The polymer undercoat layer 116 is obtained by application and drying of alcohol-soluble polyamide, and has a function of strongly joining the charge collection electrode 336 and the charge generation layer 344.

The charge generating layer 344 includes of a charge generating agent that generates holes having a positive charge and electrons having a negative charge when it is irradiated with an electromagnetic wave, and a polymer binder. A dibromoantoanthrone pigment is used as the charge generator, and a polyvinyl butyral resin is used as the polymer binder. The charge transport layer 342 includes a charge transport agent that transports only holes, and a polymer binder. As the charge transport agent, N,N'-diphenyl-N,N'-bis(3-methylphenyl)-[1,1'-biphenyl]-4,4'-diamine is used. As the polymer binder, polycarbonate is used. The bias electrode 346 is made of IZO.

The inter-layer insulation layer 316 includes an acrylic double-sided adhesion tape. The fluorescent layer 350 includes KODAK Lanex Regular ($Ga_2O_2S$: Tb) that is a fluorescent sheet manufactured by KODAK Company. The fluorescent layer 350 converts radiation, which has been transmitted through an inspection object of an imaging target to be examined when irradiating the inspection object with radiation, into visible light.

The radiation detection unit 220 was manufactured in the following way. First, Mo was deposited into a film with a thickness of 40 nm by sputtering on the flexible substrate 310 formed by attaching thin glass with a thickness of 0.15 mm and PEN with a thickness of 0.1 mm to each other, and subjected to patterning through photolithography and wet etching, to form the gate electrode 322 and the storage capacitor lower electrode 332.

On the resultant structure, silicon dioxide was deposited into a film with a thickness of 200 nm by sputtering to form the dielectric layer 314 that also functions as an insulation layer.

Next, IZO was deposited into a film with a thickness of 200 nm by sputtering without introducing oxygen during deposition, and subjected to patterning through photolithography and wet etching, to form the source electrode 326, the drain electrode 324, and the storage capacitor upper electrode 334. The edges of the source electrode 326 and the drain electrode 324 facing each other formed a tapered angle of 25°.

Next, IGZO was deposited into a film with a thickness of 10 nm by sputtering, and subjected to patterning through photolithography and wet etching, to form the active layer 328.

Next, amorphous $Ga_2O_3$ was deposited into a film with a thickness of 10 rim by sputtering, and only an area covering the active layer 328 was remained to form the protective layer 329.

Next, the inter-layer insulation film 338 made of acrylic resin was applied and the contact hole 339 was formed in the inter-layer insulation layer 338 on the storage capacitor upper electrode 334.

Next, IZO was deposited into a film with a thickness of 40 nm and then patterned to form the charge collection electrode (lower electrode) 336. The charge collection electrode 336 was connected to the storage capacitor upper electrode 334 through the contact hole 339.

Next, alcohol-soluble polyamide was applied by spin coating onto the charge collection electrode 336 in a thickness of 0.1 μm, and dried to form the polymer undercoat layer 312.

Next, the dibromoantoanthrone pigment and the polyvinyl butyral resin were added in the mass ratio of 50:50 to cyclohexanone, and dispersed. The obtained dispersion was applied by spin coating onto the polymer undercoat layer 312, to form the charge generation layer 344 of 0.5 μm thickness.

Next, 3.5 g of N,N'-diphenyl-N,N'-bis(3-methylphenyl)-[1,1'-biphenyl]-4,4'-diamine and 6.5 g of polycarbonate (molecular weight: about 35,000 to 40,000) as a charge transport agent were dissolved in 35 g of methylene chloride, and the obtained solution was applied onto the charge generation layer 344 by bar coating to form the charge transport layer 342. The charge transport layer 342 was dried at 135° C. for 1 hour, and measured for the film thickness. The measured thickness was 2 μm.

Next, IZO was deposited into a film with a thickness of 100 nm on the charge transport layer 342 to form the bias electrode layer 346.

Next, KODAK Lanex Regular ($Ga_2O_2S$: Tb 380 μm) being a fluorescent sheet manufactured by KODAK Company was prepared, and the fluorescent sheet and the bias electrode layer 346 were attached to each other with the adhesive layer 124 (with a thickness of 20 μm) of an acrylic double-sided adhesion tape interposed therebetween, to manufacture the radiation detection unit 220 of the imaging unit 210 of the indirect conversion type imaging apparatus 200.

In the indirect conversion type imaging apparatus 200 according to this exemplary embodiment, the radiation that has transmitted through a subject to be inspected is incident onto the fluorescent layer 350 and is converted into visible light that is an electromagnetic wave with a wavelength longer than that of the radiation by the fluorescent layer 350. The converted visible light is converted into holes having a positive charge and electrons having a negative charge in the organic photoelectric conversion layer 340. The converted holes in the organic photoelectric conversion layer 340 migrate through the charge transport layer 342 due to an electric potential difference between the bias electrode 346 and the charge collection electrode 336, and were collected to the bias electrode 346. The converted electrons in the organic photoelectric conversion layer 340 are stored in the storage capacitor 330 including the storage capacitor upper electrode 334 connected to the charge collection electrode 336, the storage capacitor lower electrode 332, and the dielectric layer 314 therebetween. The storage capacitor upper electrode 334 and the drain electrode 324 are connected to each other. Therefore, when an ON-voltage is applied to the gate electrode 322 to turn on the thin film transistor 320, the charge stored in the storage capacitor 330 is transmitted from the drain electrode 324 through the signal wiring line 228 (see FIG. 4) and is input to the signal processing unit 244 (see FIG. 4). After the charges are input to the signal processing unit 244 (see FIG. 4), the charges are appropriately A/D-converted and stored in an image memory (not shown). Radiation image information stored in the image memory (not shown) or the like is displayed as a visible image on a display unit of a display apparatus (not shown).

Next, an imaging method using the indirect conversion type radiation imaging apparatus 200 will be described.

The radiation generation device 270, the gate line driver 242, the signal processing unit 244, the bias voltage application circuit 246, and the reference electric potential imparting circuit 248 were controlled by the control unit 260, thereby a bias voltage of −20 V was applied to the bias electrode 346 during a bias application time of 20 seconds, and in this condition the radiation generation device 270 applied an X ray with a radiation dosage of 400 mR (80 kVp) by ten shots at an interval of 30 seconds. The X ray sensitivity for each shot was read from a captured image and the X ray sensitivities for all shots were compared.

Before each shot, the source electrodes 326 (connected to the charge collection electrodes 336 which are pixel electrodes) and the drain electrodes 324 of the thin film transistors 320 are electrically conducted by applying the ON-voltage to the gates of the thin film transistors 320 by the gate line driver 242 under the control of the control device 260. In this state, the sensitivity stabilization process was performed by switching the changeover switches (not shown) in the signal processing unit 244 and the reference electric potential imparting circuit 248 under the control of the control device 260 to change the connection of the signal wiring lines 228 from the signal processing unit 244 to the reference electric potential imparting circuit 248, imparting a ground potential to the respective signal wiring lines 228 by the reference electric potential imparting circuit 248, and simultaneously imparting the ground potential to the bias electrodes 346 by the bias voltage application circuit 246 so that the bias electrodes 346 and the charge collection electrodes 336 have the same electric potential (that is, the bias electrodes 346 and the charge collection electrodes 336 are short-circuited). A bias voltage short-circuiting time before each shot was set to 10 seconds. As a consequence, variations in sensitivity of the X-ray current were within ±1% and no afterimage did occur. In this exemplary embodiment, the bias voltage short-circuiting time was set to 10 seconds. However, when the bias voltage short-circuiting time is 1 second or more, the variations in sensitivity can be sufficiently suppressed. Moreover, the variations in sensitivity can be reliably suppressed when the bias voltage short-circuiting time is 10 seconds or more.

Next, in a Comparative Example 2, the radiation generation device 270, the gate line driver 242, the signal processing unit 244, the bias voltage application circuit 246, and the reference electric potential imparting circuit 248 were controlled by the control unit 260, thereby a bias voltage of −20 V was applied to the bias electrode 346, and in this condition, the radiation generation device 270 applied an X ray with a radiation dosage of 400 mR (80 kVp) by ten shots at an interval of 30 seconds. The X-ray sensitivity for each shot was read from a captured image, and the X ray sensitivities for all shots were compared. The constant bias voltage of −20 V was kept to be applied to the bias electrodes 346 without performing the sensitivity stabilization process. As a consequence, variations in sensitivity of the X-ray current were 5% or more and afterimage occurred.

In this exemplary embodiment, all the gates of the thin film transistors 320 were maintained to be in the ON state while the bias electrodes 346 and the charge collection electrodes 336 were set to have the same electric potential. However, it is preferable to alternately repeat the ON state and the OFF state of the gates in terms of no variation in the minimum threshold value of the thin film transistors 320. When the bias electrodes 346 and the charge collection electrodes 336 are once set to have the same electric potential, the charge collection electrodes 336 changes to a floating state from the same electric potential state even though the gates of the thin film transistors 320 are turned off. Therefore, there is almost no influence on the advantage of suppressing the variations in sensitivity. Therefore, when the bias voltage short-circuiting time including the period during which the gates are turned off is 1 second or more, the variations in sensitivity can be sufficiently suppressed. Moreover, the variations in sensitivity can be reliably suppressed when the bias voltage short-circuiting time including the period during which the gates are turned off is 10 seconds or more.

It is general that several frames can be scanned for 1 second. Therefore, even when all the gates of the thin film transistors 320 are not simultaneously turned on, the bias electrodes 346 and all the charge collection electrodes 336 come to have the same electric potential if the gates of the thin film transistors 320 are turned on sequentially one line after another in the initial frame. Therefore, even if there is a period in which the gates of the thin film transistors 320 are subsequently turned off, the charge collection electrodes 336 just change to the floating state from the same electric potential state. Therefore, the advantage of suppressed variations in sensitivity is hardly influenced.

Although the gadolinium sulfur compound (GOS: Tb) was used as the fluorescent sheet 126 in the first exemplary embodiment or as the fluorescent layer 350 of the second exemplary embodiment, cesium iodide (CsI: Tl) is preferably used.

The fluorescent sheet 126 in the first exemplary embodiment and the fluorescent layer 350 in the second exemplary embodiment are used as the scintillator converting radiation into visible light, however, if such scintillator is not used, the radiation dosage monitor 100 according to the first exemplary embodiment can be used as a visible right dosage monitor and the indirect conversion type radiation imaging apparatus 200 according to the second exemplary embodiment can be used as a visible light imaging apparatus.

In the first and second exemplary embodiments, the sensitivity may be stabilized when irradiation is performed with the X-ray dosage of 400 mR (80 KVp) by ten shots at an interval of 30 seconds. However, the sensitivity may be stabilized even in the case in which the apparatus is used for 100 shots at an interval of 30 seconds if an X ray is irradiated with a small dosage (for example, 30 mR or less, for imaging of a chest) for successive imaging for a long time as well as in the case in which an X ray is irradiated with a large dosage as in the first and second exemplary embodiments, for example, for imaging of a lumber spine.

The thickness of the charge generation layer 118 according to the first exemplary embodiment is 0.5 µm and the thickness of the charge generation layer 344 according to the second exemplary embodiment is 0.5 µm. However, thickness of the charge generation layer is preferably in the range from 0.5 µm to 3 µm.

The thickness of the charge transport layer 120 according to the first exemplary embodiment is 2 µm and the thickness of the charge transport layer 342 according to the second exemplary embodiment is 2 µm. However, the thickness of the charge transport layer is preferably in the range from 0.5 µm to 7 µm. When the charge transport layer is thin in the range from 0.5 µm to 7 µm, the short-circuiting time of the sensitivity stabilization process may preferably be shortened. The charge transport layer is a transparent layer with respect to an electromagnetic wave which generates charges in the charge generation layer. No charges are generated in the charge transport layer by the electromagnetic wave that generates charge in the charge generation layer.

In the first and second exemplary embodiments, during the short-circuiting time of the sensitivity stabilization process, the charge generation layer 118, the charge generation layer 344, the charge transport layer 120, and the charge transport layer 342 are not irradiated with erasing light. Thus, according to the first and second exemplary embodiments, the sensitivity may be stabilized even without irradiation of erasing light.

Each of the charge generation layer 118 and the charge generation layer 344 in the first and second exemplary embodiments contains a charge generator and a polymer binder as components. As the charge generator, for example, phthalocyanine dyes or phthalocyanine pigments such as metal phthalocyanine and metal-free phthalocyanine, naphthalocyanine dyes or naphthalocyanine pigments, indigo dyes, quinacridone dyes, anthraquinone dyes, antoanthrone dyes such as dibromoantoanthrone, perylene dyes, azo dyes such as monoazo dyes, bisazo dyes and trisazo dyes, and cyanine dyes are preferably used.

An example of the polymer binder that is used in the charge generation layer 118 and the charge generation layer 344 includes polyvinyl butyral.

The ratio of the charge generator to the polymer binder in the mass ratio of the former:the latter is preferably selected from a range of 80:20 to 20:80, in terms of the balance between sensitivity stability and temporal stability. The ratio is more preferably selected from a range of 45:55 to 25:75.

A charge generator is dispersed in a solution in which a polymer binder is dissolved in a solvent to prepare a dispersion, and the dispersion is subjected to spin-coating and drying (also called baking) to evaporate the solvent to form the charge generation layer 118 and the charge generation layer 344.

Each of the charge transport layer 120 and the charge transport layer 342 of the first and second exemplary embodiments contains a charge transport agent and a polymer binder as components.

As the charge transport agent, those known as a hole transport substance is preferably used. For example, examples of the charge transport agent include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a condensed aromatic carbocyclic compound (a naphthalene derivative, anthracene derivative, a phenanthrene derivative, a tetracene derivative, a pyrene derivative, a perylene derivative, a fluoranthene derivative), and a metal complex that has nitrogen-containing heterocyclic compound as a ligand. However, the charge transport agent is not limited thereto, and if it is an organic compound that has less ionization potential than that of an organic compound used as a charge generator, such organic compound may be used as a charge transport agent.

Examples of the polymer binder that is used in the charge transport layer 42 include polycarbonate, polyvinyl butyral, a homopolymer of acrylic acid ester or a copolymer of acrylic acid with other copolymeric monomers, a homopolymer of methacrylic acid ester or a copolymer of methacrylic acid with other copolymeric monomers, a homopolymer of styrene or a copolymer of styrene with other copolymeric monomers, for example, a copolymer with acrylonitrile, and polysulfone.

The charge transport layer is formed by preparing a solution in which a charge transport agent and a polymer binder are dissolved in a solvent, and applying the solution onto the charge generation layer by, for example, dip coating and spin coating, and baking the charge generation layer to evaporate the solvent.

Various exemplary embodiments of the invention have hitherto been described, however the invention is not limited the exemplary embodiments. Accordingly, the scope of the invention is limited only by the appended claims.

What is claimed is:

1. An electromagnetic wave information detection apparatus, comprising:
    a photoelectric converter including: a first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and a second electrode layer that is electrically connected to the charge transport layer;
    an electric potential imparting unit that imparts respective electric potentials to the first and second electrode layers;
    a detection unit that is connected to the photoelectric converter and is configured to detect the information, which is carried by the electromagnetic wave and photoelectrically converted by the photoelectric converter; and
    a control unit that controls the electric potential imparting unit and the detection unit such that the electric potential imparting unit equalizes the electric potentials of the first and second electrode layers during a predetermined period of time between a process in which the electric potential imparting unit imparts respective detection electric potentials to the first and second electrode layers and the detection unit detects information carried by an electromagnetic wave of a previous irradiation and a process in which the electric potential imparting unit imparts the respective detection electric potentials to the first and second electrode layers and the detection unit detects information carried by an electromagnetic wave of a subsequent irradiation,
    wherein the photoelectric converter is not irradiated with erasing light while the electric potential imparting unit equalizes the electric potentials of the first and second electrode layers during the predetermined period of time.

2. The electromagnetic wave information detection apparatus of claim 1, wherein the predetermined period of time is 1 second or more.

3. The electromagnetic wave information detection apparatus of claim 2, wherein the predetermined period of time is 10 seconds or more.

4. The electromagnetic wave information detection apparatus of claim 1, wherein an organic compound is used as a charge generator of the charge generation layer and an organic compound is used as a charge transport agent of the charge transport layer.

5. The electromagnetic wave information detection apparatus of claim 1, wherein the charge transport layer is a transparent layer for an electromagnetic wave that causes the charge to be generated in the charge generation layer.

6. The electromagnetic wave information detection apparatus of claim 1, wherein the charge transport layer is a layer that transports only holes.

7. The electromagnetic wave information detection apparatus of claim 1, further comprising a radiation conversion layer that converts a radiation ray into an electromagnetic wave with a wavelength longer than that of the radiation ray.

8. The electromagnetic wave information detection apparatus of claim 1,
    wherein the detection unit includes: a charge storage capacitor connected to one of the first or second electrode layers; a switching unit; and a reading unit that reads an amount of charge stored in the charge storage capacitor, and
    wherein one terminal of the switching unit is connected to one of the first or second electrode layers and the charge storage capacitor and another terminal of the switching unit is connected to the reading unit.

9. The electromagnetic wave information detection apparatus of claim 1, wherein the detection unit is connected between the first and second electrode layers and detects an amount of current between the first and second electrode layers, and wherein the electromagnetic wave information detection apparatus is a dosage detection apparatus.

10. An electromagnetic wave information detection apparatus, comprising:
- a photoelectric converter including: a first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and a second electrode layer that is electrically connected to the charge transport layer;
- an electric potential imparting unit that imparts respective electric potentials to the first and second electrode layers;
- a detection unit that is connected to the photoelectric converter and is configured to detect the information, which is carried by the electromagnetic wave and photoelectrically converted by the photoelectric converter; and
- a control unit that controls the electric potential imparting unit and the detection unit such that the electric potential imparting unit equalizes the electric potentials of the first and second electrode layers during a predetermined period of time between a process in which the electric potential imparting unit imparts respective detection electric potentials to the first and second electrode layers and the detection unit detects information carried by an electromagnetic wave of a previous irradiation and a process in which the electric potential imparting unit imparts the respective detection electric potentials to the first and second electrode layers and the detection unit detects information carried b an electromagnetic wave of a subsequent irradiation,
- wherein the detection unit includes: a charge storage capacitor connected to one of the first or second electrode layers; a switching unit; and a reading unit that reads an amount of charge stored in the charge storage capacitor, and
- wherein one terminal of the switching unit is connected to one of the first or second electrode layers and the charge storage capacitor and another terminal of the switching unit is connected to the reading unit, and wherein the control unit controls the electric potential imparting unit, the detection unit, the switching unit, and the reading unit such that, during a period in which the electric potentials of the first and second electrode layers are equalized for the predetermined period of time by the electric potential imparting unit, the electric potential imparting unit is connected to the other terminal of the switching unit and the switching unit connects the electric potential imparting unit to the one of the first electrode layer or the second electrode layer to set the electric potential of the one of the first or second electrode layers and the electric potential of the other of the first or second electrode layers so that the respective electric potentials are the same during the predetermined period of time.

11. An electromagnetic wave information detection method, comprising:
- detecting information, which is carried by an electromagnetic wave of an irradiation and is photoelectrically converted by a photoelectric converter, by imparting respective detection electric potentials to first and second electrode layers of the photoelectric converter, which includes: the first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and the second electrode layer, which is electrically connected to the charge transport layer;
- thereafter equalizing electric potentials of the first and second electrode layers during a predetermined period of time; and
- thereafter detecting information of an electromagnetic wave of a subsequent irradiation by imparting the respective detection electric potentials to the first and second electrode layers of the photoelectric converter,
- wherein the photoelectric converter is not irradiated with erasing light while the electric potentials of the first and second electrode layers are equalized during the predetermined period of time.

12. The electromagnetic wave information detection method of claim 11, wherein the predetermined period of time is 1 second or more.

13. The electromagnetic wave information detection method of claim 12, wherein the predetermined period of time is 10 seconds or more.

14. The electromagnetic wave information detection method of claim 11, wherein an organic compound is used as a charge generator of the charge generation layer and an organic compound is used as a charge transport agent of the charge transport layer.

15. The electromagnetic wave information detection method of claim 11, wherein the charge transport layer is a transparent layer for an electromagnetic wave that causes the charge to be generated in the charge generation layer.

16. The electromagnetic wave information detection method of claim 11, wherein the charge transport layer is a layer that transports only holes.

17. The electromagnetic wave information detection method of claim 11, wherein the electromagnetic wave is an electromagnetic wave that has been converted by a radiation conversion layer that converts a radiation ray into an electromagnetic wave with a wavelength longer than that of the radiation ray.

18. An electromagnetic wave information detection method, comprising:
- detecting information, which is carried by an electromagnetic wave of an irradiation and is photoelectrically converted by a photoelectric converter, by imparting respective detection electric potentials to first and second electrode layers of the photoelectric converter, which includes: the first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and the second electrode layer, which is electrically connected to the charge transport layer;
- thereafter equalizing electric potentials of the first and second electrode layers during a predetermined period of time; and
- thereafter detecting information of an electromagnetic wave of a subsequent irradiation by imparting the respective detection electric potentials to the first and second electrode layers of the photoelectric converter,
- wherein the detecting of the information, which is carried by the electromagnetic wave and is photoelectrically converted by the photoelectric converter, by imparting the respective detection electric potentials to first and second electrode layers of the photoelectric converter includes storing charge corresponding to the charge that has been photoelectrically converted by the photoelectric converter in a charge storage capacitor connected to one of the first or second electrode layers during the irradiation of the electromagnetic wave and detecting an amount of the charge stored in the charge storage capacitor after the irradiation of the electromagnetic wave via a switching unit, and wherein the equalizing of the electric potentials of the first and second electrode layers during the predetermined period of time includes setting the electric potential imparted to the one of the first or second electrode layers via the switching unit and the electric potential imparted to the other of the first and second electrode layers so that the respective electric potentials are the same during the predetermined period of time.

19. An electromagnetic wave information detection method, comprising:

detecting information, which is carried by an electromagnetic wave of an irradiation and is photoelectrically converted by a photoelectric converter, by imparting respective detection electric potentials to first and second electrode layers of the photoelectric converter, which includes: the first electrode layer; a charge generation layer that generates positive charge and negative charge upon being irradiated with an electromagnetic wave carrying information and that is electrically connected to the first electrode layer; a charge transport layer that transports only either the positive charge or the negative charge generated in the charge generation layer; and the second electrode layer, which is electrically connected to the charge transport layer;

thereafter equalizing electric potentials of the first and second electrode layers during a predetermined period of time; and thereafter detecting information of an electromagnetic wave of a subsequent irradiation by imparting the respective detection electric potentials to the first and second electrode layers of the photoelectric converter, wherein the detecting of the information, which is carried by the electromagnetic wave and is photoelectrically converted by the photoelectric converter, by imparting the respective detection electric potentials to first and second electrode layers of the photoelectric converter includes detecting an amount of current between the first and second electrode layers so that a dosage of the electromagnetic wave is detected, and wherein the electromagnetic wave information detection method is a dosage detection method.

\* \* \* \* \*